United States Patent [19]

Dekker et al.

[11] Patent Number: 5,569,952
[45] Date of Patent: Oct. 29, 1996

[54] SEMICONDUCTOR DEVICE WITH A SEMICONDUCTOR ELEMENT PROVIDED IN A MESA STRUCTURE

[75] Inventors: Ronald Dekker; Henricus G. R. Maas; Dirk J. Gravesteijn; Martinus P. J. G. Versleijen, all of Eindhoven, Netherlands

[73] Assignee: U.S. Philips Corporation, New York, N.Y.

[21] Appl. No.: 316,304

[22] Filed: Sep. 30, 1994

[30] Foreign Application Priority Data

Oct. 1, 1993 [BE] Belgium ............................... 09301029

[51] Int. Cl.⁶ ................... H01L 23/50; H01L 29/417; H01L 29/70
[52] U.S. Cl. ................... 257/579; 257/584; 257/586; 257/626
[58] Field of Search ................... 257/152, 164, 257/166, 170, 331, 341, 579, 584, 586, 587, 600, 734, 773, 622–626, 578

[56] References Cited

U.S. PATENT DOCUMENTS

| | | | |
|---|---|---|---|
| 4,035,831 | 7/1977 | Saeki | 357/79 |
| 4,247,859 | 1/1981 | Rai-Choudhury et al. | 357/4 |
| 4,542,398 | 9/1985 | Yatsuo et al. | 357/38 |
| 4,739,387 | 4/1988 | Temple et al. | 257/170 |
| 5,389,552 | 2/1995 | Iranmanesh | 257/579 |

FOREIGN PATENT DOCUMENTS

| | | | |
|---|---|---|---|
| 2077332 | 10/1971 | France | H01L 11/00 |
| 2601131 | 10/1976 | Germany . | |
| 3134074 | 5/1982 | Germany | H01L 29/60 |
| 0163865 | 9/1984 | Japan | 257/170 |

OTHER PUBLICATIONS

Patent Abstracts of Japan vol. 16, No. 330 (E1287) Kokai #4–199719 Inami et al. Jul. 20, 1992.

*Primary Examiner*—Peter Toby Brown
*Attorney, Agent, or Firm*—Steven R. Biren

[57] ABSTRACT

A semiconductor device includes a semiconductor body (1) having a semiconductor element with connection points (2, 3) which adjoins a surface (4) of the semiconductor body (1) and is laterally insulated and surrounded by a first depression (5) in the surface (4), which depression (5) is provided with a wall (6) and a bottom (7), while the surface (4) of the semiconductor body (1) and the wall (6) and bottom (7) of the depression (5) are covered with an insulating layer (8). The connection points (2, 3) are provided in the insulating layer (8) on the surface (4) of the semiconductor body (1) and are connected to conductor tracks (10, 11) which connect the connection points (2, 3) across a wall (6) to connection surfaces (12, 13) associated with the connection points (2, 3) and situated on the bottom (7). It is found in practice that, in the case of progressive miniaturization, the manufacture of such devices leads to rejects caused by short-circuits between connection surfaces (12, 13). According to the invention, one or several further depressions (50) surrounded by the first depression (5) is/are present in the surface (4) of the semiconductor body (1), while only one connection surface (12, 13) is present on the bottom (7, 57) of each of the first and further depressions (5, 50), which connection surface is connected to a connection point (2, 3) on the surface (4) of the semiconductor body (1) via a conductor track (10, 11). Short-circuits are found to take place in the known semiconductor devices on a wall (6) of the depression (5) when there are more than one conductor tracks (10, 11) on this wall (6). Here, however, only one conductor track (10 or 11) is present on the wall (6, 56 of the depression (5, 50), so short-circuits with other conductor tracks on the wall (6, 56) cannot arise.

7 Claims, 5 Drawing Sheets

SEMICONDUCTOR DEVICE WITH A SEMICONDUCTOR ELEMENT PROVIDED IN A MESA STRUCTURE

BACKGROUND OF THE INVENTION

The invention relates to a semiconductor device with a semiconductor body comprising a semiconductor element with connection points, which semiconductor element adjoins a surface of the semiconductor body and is laterally insulated and surrounded by a first depression in the surface, which depression is provided with a wall and a bottom, while the surface of the semiconductor body and the wall and the bottom of the depression are covered with an insulating layer, the connection points being provided in the insulating layer on the surface of the semiconductor body, and being connected to conductor tracks which connect the connection points across a wall to connection surfaces belonging to the connection points and situated on a bottom.

Such a device is also known as a semiconductor device with mesa insulation. The upper portion of the semiconductor body adjoining the surface and surrounded by the depression in fact forms a mesa with an upper side, a wall, and a bottom next to the mesa. The semiconductor element is possibly present partly in the mesa. The connection points of the semiconductor element present on the upper side of the mesa form connection points for, for example, base, emitter, collector, source, drain, anode or cathode zones or for gate electrodes of switching elements such as, for example, transistors, diodes, or thyristors. The semiconductor element may comprise several such switching elements and also resistor zones and capacitors. In general, the connection points are formed by contact holes in the insulating layer which covers the upper side of the mesa. Through these contact holes, semiconductor or conductor regions in the mesa are connected to the conductor tracks. The connection points are electrically connected by means of the conductor tracks to connection surfaces or bond pads, which are usually made of the same material as the conductor track. In general, each connection point of the semiconductor element has its own bond pad. Thus, for example, an emitter connection point will be connected to an emitter bond pad. The bond pads serve to make electrical contact with connection legs of a lead frame, for example, through bond wires or contact elevations, so-called bumps. The bond pads are comparatively large in order to facilitate such a contact. The bond pads accordingly are present next to the mesa on the bottom of the depression and not directly on the surface of the semiconductor body on top of the mesa. The placement of comparatively large bond pads on the upper side of the mesa, i.e. on the semiconductor element, would lead to an enlargement of the mesa, which leads to comparatively high capacitances in the semiconductor element, whereby the semiconductor element is not suitable, for example, for high frequencies.

Patent Abstracts of Japan vol. 16, no. 330 [4-199719] discloses a device of the kind mentioned in the opening paragraph with a high electron mobility transistor (HEMT) as a semiconductor element in a mesa. Connection points for the gate, source, and drain of the transistor are present on the surface of the semiconductor body, on the upper side of the mesa. These connection points are connected to bond pads on the bottom of the depression through conductor tracks, i.e. next to the mesa.

In practice, semiconductor devices with ever smaller details are manufactured owing to an increasing miniaturization. The known semiconductor device has the disadvantage that the manufacture of miniaturized known semiconductor bodies leads to rejects owing to short-circuits between bond pads of the semiconductor element.

SUMMARY OF THE INVENTION

The invention has for its object inter alia to design the semiconductor device mentioned in the opening paragraph in such a manner that the said disadvantages do not occur.

According to the invention, the device is for this purpose characterized in that one or several further depressions are present in the surface of the semiconductor body and surrounded by the first depression, only one connection surface being present on the bottom of the first and of (each of) the further depression(s), which connection surface is connected to a connection point on the surface of the semiconductor body through a conductor track.

The first and the further depressions do not merge into one another. The depressions have no direct connections to one another. The surface area occupied by the upper side of the mesa is preferably no larger than the surface area of the mesa without the further depression. It is found that short-circuits between the connection surfaces in the known device are due to short-circuiting of the conductor tracks which connect the connection points to the connection surfaces. The invention is based on the recognition that short-circuits take place when more than one conductor track is present on the wall of a depression. The short-circuit is found to take place between the tracks on the wall of the depression. Especially the formation of the conductor tracks on the wall through patterning of a photoresist and etching of a conducting layer, for example, by reactive ion etching (RIE), gives rise to short-circuits. When the illumination of the photoresist or etching of the conducting layer takes place imperfectly owing to a comparatively steep wall of the depression, traces of the conducting layer remain between the tracks on the wall, whereby these conductor tracks can be short-circuited. Often a continuous conducting layer is created then all around the mesa on the wall. The measure according to the invention means that there is only one connection surface per depression which is connected by one conductor track to one connection point on the upper side of the mesa. There is only one conductor track on the wall of the depression, so short-circuiting with other tracks cannot occur. Since the depressions are fully separated from one another, i.e. have no connections to one another, short-circuiting between conductor tracks in different depressions is not possible.

It is noted that it is possible for a semiconductor element, for example a transistor, to be provided with a connection point, for example an emitter connection point, which comprises several contact holes to a number of separate regions, in this case emitter regions. In such a situation the contact holes of the emitter regions together form the emitter connection point of the transistor. The contact holes of the separate emitter regions may be connected to one connection surface in a depression by means of conductor tracks.

The conductor tracks may be manufactured from various materials such as aluminium or polysilicon. In a preferred embodiment of the invention, the conductor tracks comprise gold. Conductor tracks comprising gold have a low resistance, which renders possible high switching frequencies of the semiconductor element. When the bond pad is also made from an alloy comprising gold, there will be no corrosion problems between bond pads and gold bond wires or bumps such as those which are widely used for making connections between connection surfaces and a connection leg of the housing. The very nature of the noble metal gold implies that layers comprising gold have comparatively bad etching properties, so that an increasing miniaturization in the known device may readily lead to short-circuits between conductor tracks. Such problems do not arise in a device according to the invention.

In a further embodiment, the walls of the depressions enclose an angle of more than 50° with the bottom of the depressions. This embodiment has the advantage that the mesa structure is sharply defined, whereby parasitic capacitances in the semiconductor element remain small. The device according to the invention gives no problems involving short-circuiting of conductor tracks even at such an acute angle between the wall and the bottom.

In an embodiment of the device, the conductor track is patterned only on the surface of the semiconductor body and on the bottom of the depression. The conductor tracks on the walls of the depressions are not patterned then. The wall is entirely covered with a conducting layer. Owing to the special geometry of the semiconductor device, no short-circuiting between bond pads occurs even in that case.

In a further embodiment of the invention, a further connection point of the semiconductor element provided with a connection surface is present on the bottom of a depression. The further connection point on the bottom of a depression may be, for example, a connection point for a collector contact of a vertical transistor or a connection point for the semiconductor body. This embodiment has the advantage that a further connection point of the semiconductor element can be connected in a simple manner v/a one side of the semiconductor body without the mesa having to be larger. No buried layers or deep diffusions are thus necessary for connecting the substrate or the collector. Said further connection point is then interconnected to the accompanying connection point on the bottom of the depression through a conductor track. Two connection surfaces for different connection points are then present on the bottom of this depression, i.e. one for a connection point on top of the mesa and one for the further connection point on the bottom of the depression. In spite of the fact that there are two connection surfaces present on the bottom of this depression, only one conductor track is present on the wall of this depression, i.e. that track which connects the connection point adjoining the surface to its connection surface on the bottom of the depression. No short-circuiting can accordingly occur between the two connection surfaces on the bottom.

In a further embodiment of the invention, the semiconductor element comprises a number of semiconductor sub-elements which are interconnected by dams, the semiconductor sub-elements and the dams enclosing the further depression(s). In this embodiment, the semiconductor sub-elements are, for example, small switching elements which together form a larger switching element. The dams generally comprise a comparatively thin strip of semiconductor material with an upper surface at the same level as e surface of the semiconductor body, and extend from the bottom of the depression. This embodiment is advantageous especially when comparatively small semiconductor elements are required, for example, on account of design requirements such as a frequency range and desired power. The dimensions of the connection surfaces are then comparatively large compared with those of the semiconductor element. The sub-elements may have comparatively small dimensions in that the semiconductor element is split up into a number of semiconductor sub-elements, so that certain design requirements can be fulfilled while nevertheless there are no problems involving short-circuits between conductor tracks. The semiconductor sub-elements may be, for example, connected in parallel and thus together form one semiconductor element. The semiconductor device in this embodiment may, for example, have a mesa in a honeycomb configuration. Walls of the honeycomb then form the dams, while respective semiconductor sub-elements are present at the intersections of walls.

In a further embodiment of the invention, the semiconductor element comprises a transistor with base and emitter contacts as the connection points, the connection surface for the emitter contact lying in the first depression and the connection surface for the base contact in the further depression. This embodiment has the advantage that the placement possibility for the connection surface of the emitter connection point is wide. The connection surface for the emitter may be placed in any desired location around the semiconductor element, while it is also possible to provide more than one emitter connection surface in a simple manner. This is especially important for comparatively high-frequency transistors because the length of a connection between the emitter connection surface and a connection leg of a lead frame forms an impedance which adversely affects the high-frequency properties of the transistor. In fact, an increase in the emitter impedance increases the feedback and reduces the transistor gain. The length of the connection between the connection surface and the connection leg may be kept small through a suitable choice of the location of the connection surface belonging to the emitter. It is also possible to use several connection surfaces for the emitter, all being connected in parallel to the connection leg of the lead frame. The impedance at the emitter side of the transistor can be kept low by these measures, so that the high-frequency properties of the transistor are good.

BRIEF DESCRIPTION OF THE DRAWING

The invention will be explained in more detail below by way of example with reference to the drawing, in which.

The figures are purely diagrammatic and not drawn to scale. Corresponding parts have generally been given the same reference numerals in the figures.

DESCRIPTION OF THE PREFERRED EMBODIMENTS

Figure 1:
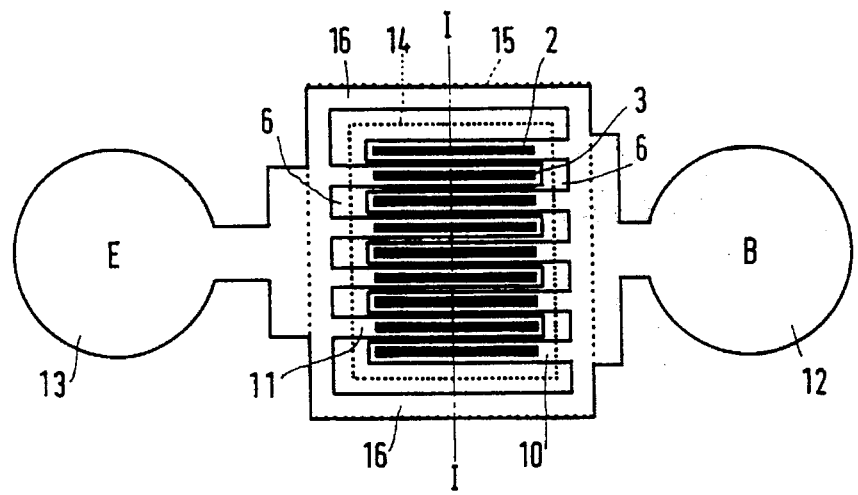
FIG. 1 is a plan view of a known semiconductor device with a transistor in a mesa structure.
Figure 2:
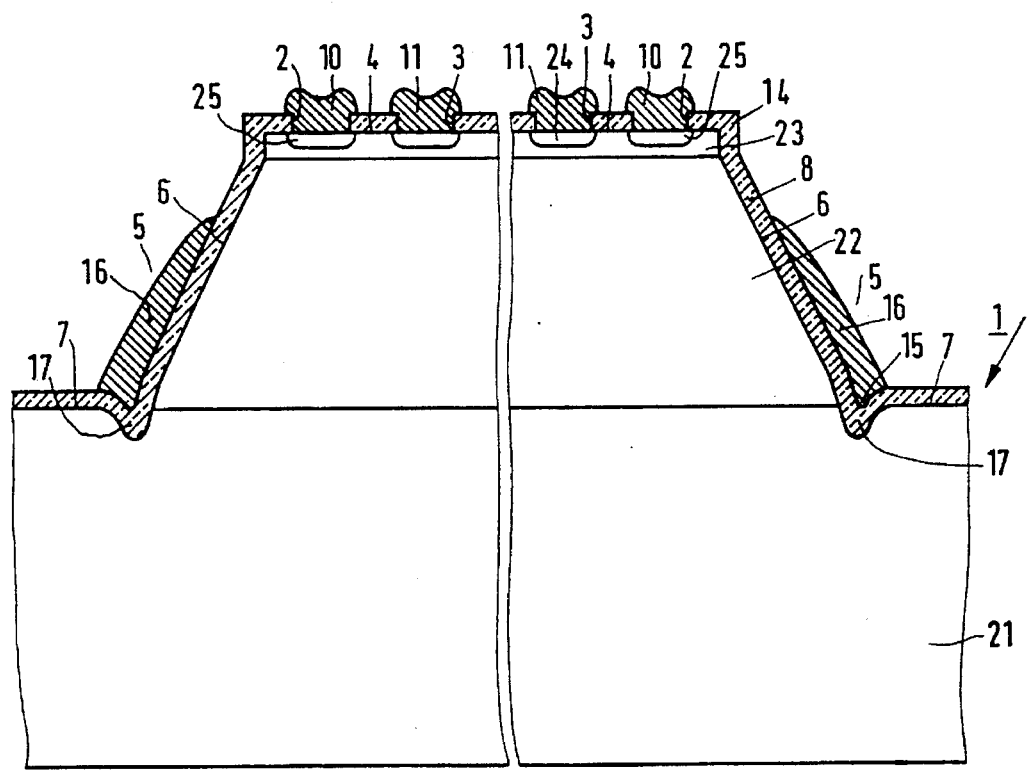
FIG. 2 is a cross-section taken on the line I—I in FIG. 1 of a known semiconductor device.

FIGS. 1 and 2 show a known semiconductor device with a semiconductor body 1 comprising a transistor as a semiconductor element with base and emitter connection points 2, 3, the semiconductor element adjoining a surface 4 of the semiconductor body 1 and being laterally insulated and surrounded by a first depression 5 in the surface 4, which depression 5 is provided with a wall 6 and a bottom 7, while the surface 4 of the semiconductor body 1 and the wall 6 and bottom 7 of the depression 5 are covered with an insulating layer 8, the connection points 2, 3 being provided in the insulating layer 8 on the surface 4 of the semiconductor body 1 and being connected to conductor tracks 10, 11 which connect the connection points 2, 3 across a wall 6 to the connection surfaces 12, 13 on a bottom 7 which belong to the connection points 2, 3.

The surface 4 of the semiconductor body 1 surrounded by the depression 5 forms a so-called mesa structure with an upper side 4, wall 6, and bottom 7 next to the mesa. In this example, the device comprises an $n^+$-type silicon substrate 21 provided with an $n^-$-type epitaxially grown layer 22. The substrate 21 and the layer 22 act as the collector region of the transistor. A p-type layer 23 which acts as the base region is provided in this layer 22 through implantation and diffusion. An $n^+$-type emitter region 24 is provided in this base region 23. The collector region 22 and the base region 23 are laterally bounded by the depression 5. Edges of the depression are indicated with dotted lines 14, 15 (FIG. 1) in plan view. The upper side 4 and the wall 6 of the mesa structure and the bottom 7 next to the mesa are covered with an insulating layer 8, in this example made of silicon oxide. The insulating layer 8 on the upper side 4 of the mesa is provided with contact holes 2, 3 which act as the connection points 2, 3 of the semiconductor element in the mesa. The connection point 2 for the base region 23 of the transistor comprises a semiconductor zone 25 with a $p^+$-type doping for contacting the base region 23. The base and emitter connection points 2, 3 are electrically connected to base and emitter connection surfaces or bond pads 12, 13 by means of conductor tracks 10, 11, which are usually made of the same material as the bond pads. The bond pads 12, 13 serve for making electrical contact with connection legs of a lead frame by means of, for example, bond wires or contact elevations, so-called bumps. The connection surfaces 12, 13 are comparatively large in order to facilitate such a contact. If the bond pads 12, 13 were placed on the upper side 4 of the mesa, i.e. on the semiconductor element, this would lead to an enlargement of the mesa, which again leads to comparatively high capacitances in the semiconductor element, whereby the semiconductor element would, for example, be unsuitable for high frequencies. The bond pads 12, 13, accordingly, are next to the semiconductor element on the bottom 7 of the depression 5 and not directly on the surface 4 of the semiconductor body 1, on top of the mesa. The conductor tracks 10, 11 which connect the connection points 2, 3 to the bond pads 12, 13 accordingly run from the surface 4 across a wall 6 of the depression 5 down to the bottom 7. In practice, semiconductor devices with ever smaller details must be made because of an increasing miniaturization. It is found that miniaturization of known semiconductor devices is accompanied by manufacturing rejects of miniaturized known devices on account of short-circuits between connection surfaces 12, 13.

Figure 3:
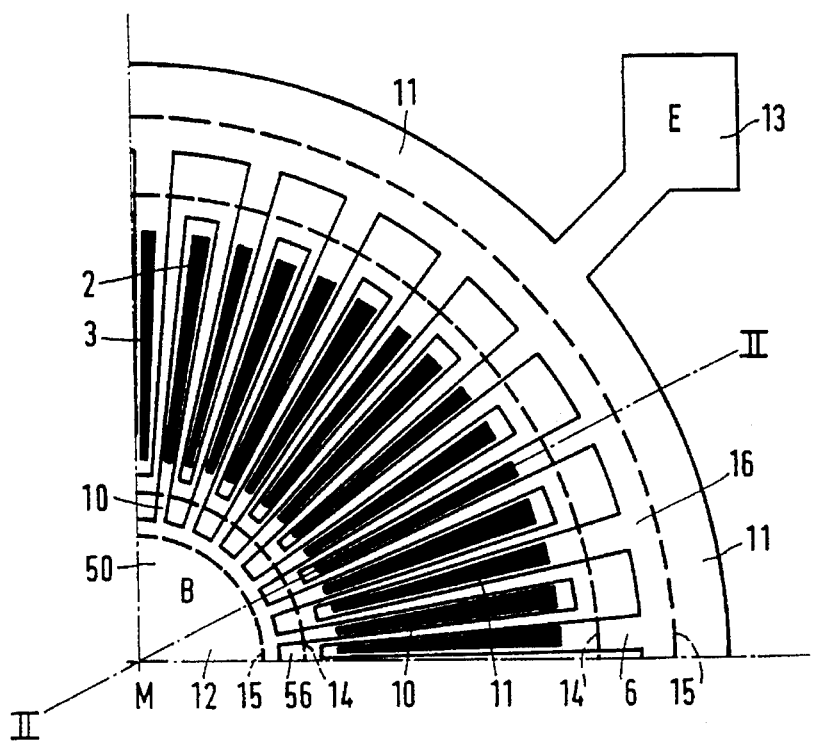
FIG. 3 view of a semiconductor device with a transistor in a mesa structure according to the invention.
Figure 4:
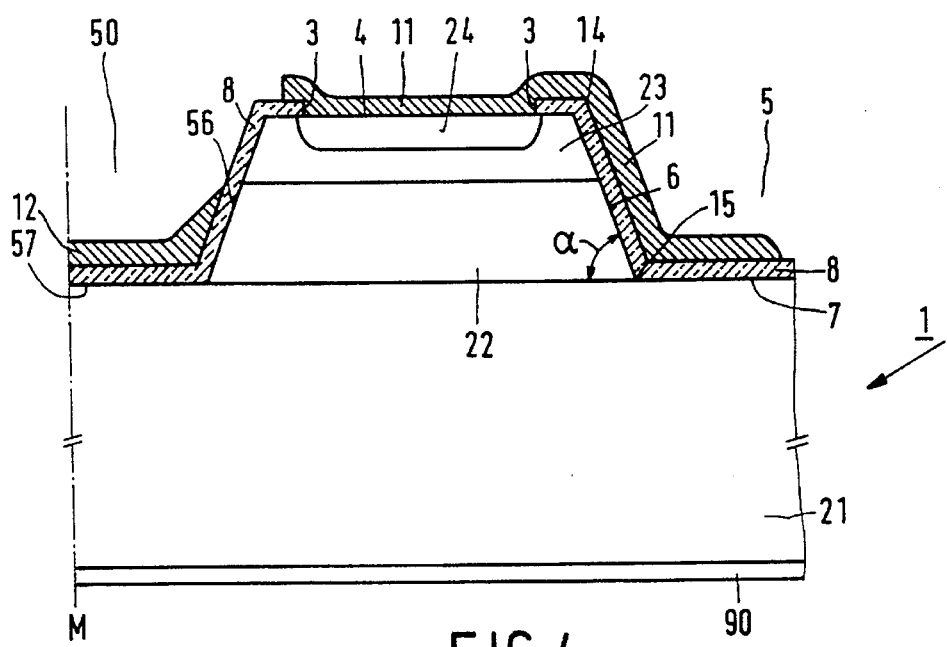
FIG. 4 is a cross-section taken on the line II—II in FIG. 3 of a semiconductor device according to the invention.

FIGS. 3 and 4 show a semiconductor device according to the invention, reference numerals corresponding to those in FIGS. 1 and 2 being used. FIG. 3 is a plan view of one quarter of the semiconductor device and FIG. 4 is a cross-section taken on the line II—II in FIG. 3. The semiconductor device is axially symmetrical around the axis M. According to the invention, one or several further depressions 50 is/are present in the surface 4 of the semiconductor body 1 and surrounded by the first depression 5, only one connection surface 13, 12 being present each time on the bottoms 7, 57 of the first and the further depression(s) 5, 50, respectively, which surface is connected to a respective connection point 3, 2 on the surface 4 of the semiconductor body 1 via a conductor track 11, 10.

The invention is based on the recognition that short-circuits between the connection surfaces 12, 13 are due to short-circuits between the conductor tracks 10, 11 connecting the connection points 2, 3 to the connection surfaces 12, 13 in the case of miniaturization of the known semiconductor device of FIGS. 1 and 2. In the known device of FIGS. 1 and 2, short-circuits between conductor tracks 10, 11 take place when more than one connection surface 12, 13 lies on the bottom 7 of one depression 5. It is found in practice that the short-circuit takes place on the wall 6 of the depression 5. Especially the manufacture of the conductor tracks 10, 11 through illumination of a photoresist on the wall 6 for patterning a conductive layer and etching of the conductive layer on the wall, for example by reactive ion etching (RIE), gives rise to problems. When the illumination of the photoresist and the etching take place imperfectly, traces 16 of the conductive layer remain on the wall 6, whereby conductor tracks 10, 11 running across this wall 6 are short-circuited. This happens especially when a groove 17 is created around the mesa structure owing to underetching during manufacture of the mesa. It is found to be very difficult to remove the conductive layer fully from the groove 17.

Due to the measure according to the invention, only one connection surface 13, 12 is present in each depression 5, 50 in the semiconductor device of FIGS. 3 and 4, connected to only one connection point 3, 2 by means of a conductor track 11, 10, respectively. There will be only one conductor track 11 on the wall 6 of the depression 5 and also only one conductor track 10 on the wall 56 of the depression 50, so that short-circuits between the tracks 10, 11 do not arise. Since the depressions 5, 50 are fully separated from one another and accordingly have no connection to one another, short-circuits between conductor tracks 10, 11 on walls 6, 56 of different depressions are not possible.

The conductor tracks 10, 11 preferably comprise gold. The known device is found to give rise to problems with progressing miniaturization especially when conductor tracks made of gold or an alloy comprising gold are used. This is connected with the fact that layers comprising gold are comparatively difficult to etch because of the noble quality of gold, so that short-circuits between conductor tracks 10, 11 may readily arise. Problems involving short-circuits between layers comprising gold can be prevented through implementation of the invention, while nevertheless the advantages of gold tracks are retained. A track comprising gold has a low resistance, which renders possible short RC times and thus high switching frequencies of the semiconductor element. When the connection surfaces 12, 13 are also made of the alloy comprising gold, in addition, there will be no corrosion problems between these connection surfaces and gold bond wires such as those which are generally used for making connections between bond pads and a connection leg of the lead frame.

In a further embodiment, the walls 6, 56 of the depressions enclose an angle α of more than 50° with the bottom 7, 57 of the depression 5, 50 (see FIG. 4). This embodiment has the advantage that the mesa structure is sharply defined, so that parasitic capacitances of the semiconductor element remain low. The device according to the invention does not give rise to problems involving short-circuits of conductor tracks 10, 11 even at such an acute angle between the wall 6, 56 and the bottom 7, 57.

In a further embodiment, the conductor track 10, 11 is patterned on the surface 4 of the semiconductor body 1 and on the bottom 7, 57 of the depression 5, 50 only. The conductor tracks 10, 11 are not patterned on the walls 6, 56 of the depressions 5, 50. The wall 6, 56, accordingly, is fully covered by a conductive layer. Owing to the special geometry of the semiconductor device according to the invention, no short-circuits between connection surfaces arise even in this case.

FIGS. 1 to 4 show that it is possible for a semiconductor element, for example a transistor, to be provided with one connection point 2, 3, which comprises a number of separate regions 24, 25, respectively. The separate semiconductor regions 24, 25 are then provided with an insulating layer 8 with a contact window for each region 24, 25. In such a situation, the contact windows of the regions 24, 25 together form the connection point 2, 3 of the transistor. The contact windows of the separate regions 24, 25 may be connected to one connection surface 12, 13 in one and the same depression 50, 5 by means of conductor tracks 10, 11.

FIGS. 3 and 4 show a first embodiment of the invention in which the semiconductor element comprises a mesa in the form of an annular structure with two connection points 2, 3 on the structure and with the first depression 5 circumferentially outside the structure and one further depression 50 inside the structure, one connection point 3 being connected to a connection surface 13 in the first depression 5 and one connection point 2 being connected to a connection surface 12 in the further depression 50. The semiconductor device of FIGS. 3 and 4 efficiently utilizes the available surface area on the semiconductor body.

Figure 5:
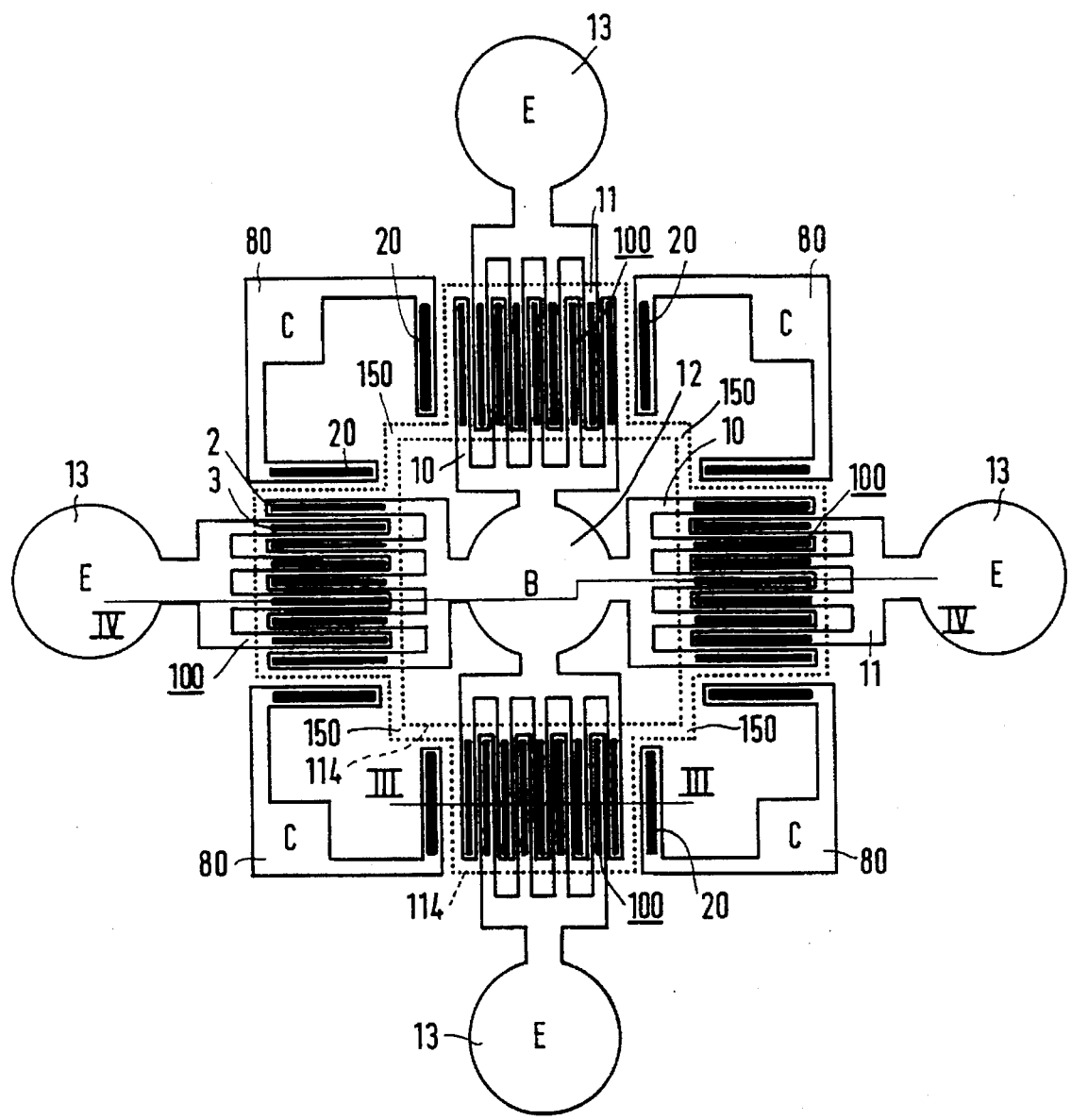
FIG. 5 is a plan view of a semiconductor device with a number of semiconductor sub-elements according to the invention.
Figure 6:
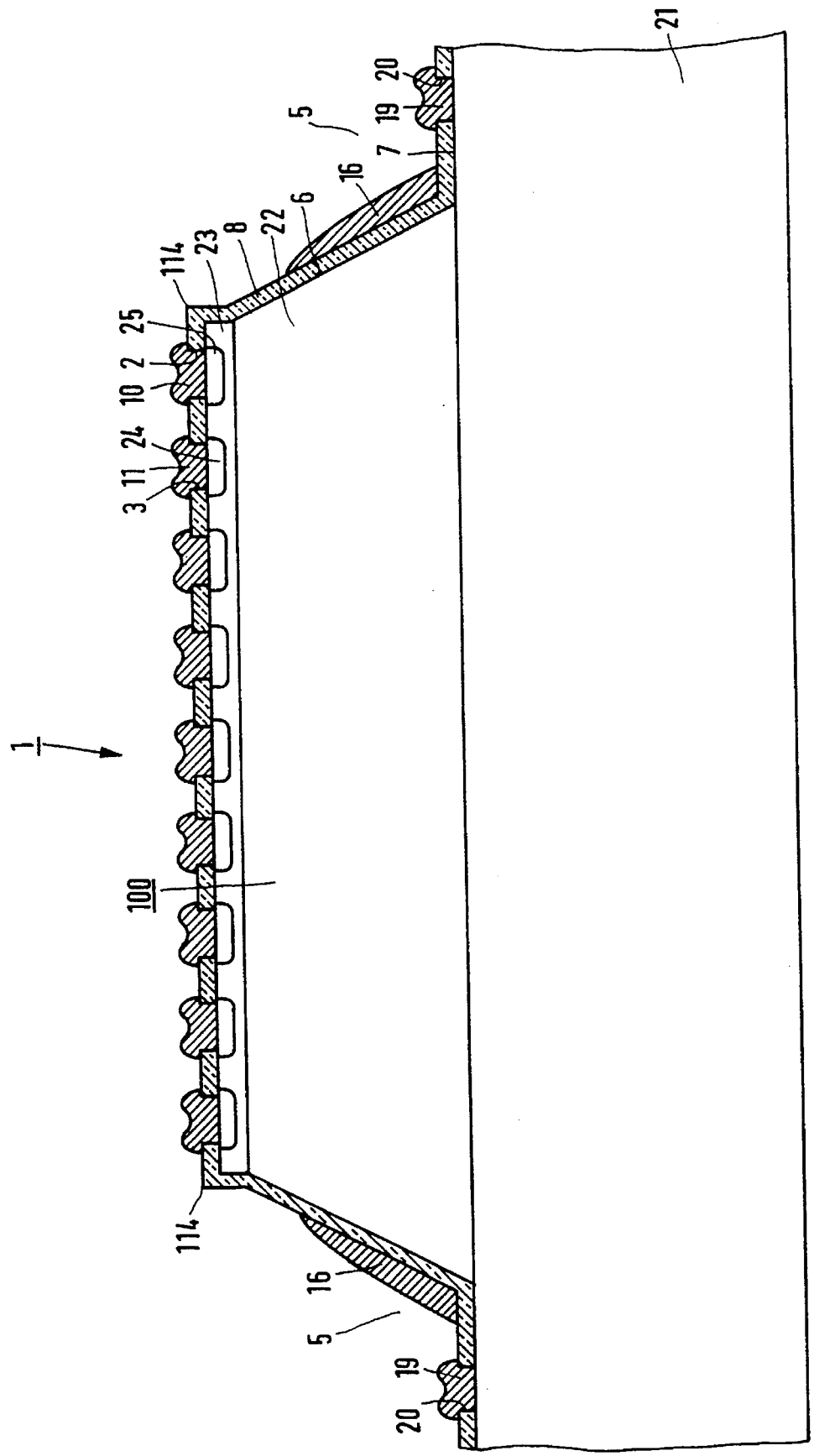
FIG. 6 is a cross-section taken on line III—III in FIG. 5 of a semiconductor device according to the invention.
Figure 7:
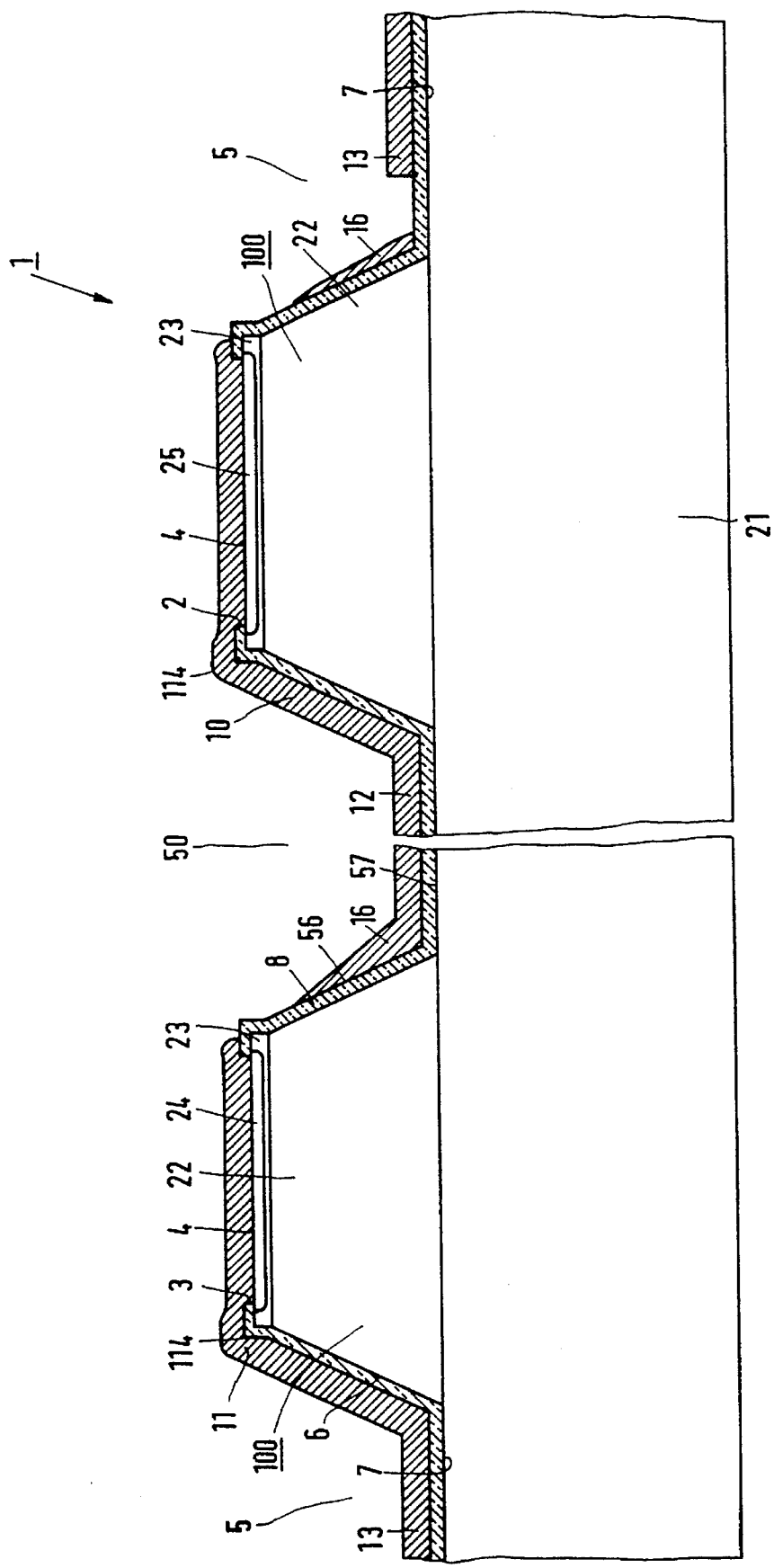
FIG. 7 is a cross-section taken on the line IV—IV in FIG. 5 of a semiconductor device according to the invention.

FIG. 5 is a plan view and FIGS. 6, 7 are cross-sections taken on the lines III—III and IV—IV, respectively, in FIG. 5 of a further embodiment of the semiconductor device according to the invention. In this embodiment, the semiconductor element comprises a number of semiconductor sub-elements 100 which are interconnected by dams 150, the semiconductor sub-elements 100 and the dams 150 enclosing the further depression 50. The semiconductor sub-elements 100 have a structure which corresponds to the structure of the semiconductor element of FIGS. 1 and 2. The dams are formed from portions of the semiconductor body in that a portion of the semiconductor body was maintained during etching of the depressions 5, 50.

In contrast to FIGS. 1 to 4, FIG. 5 shows the edges of the mesa structure not with two dottted lines 14, 15 but with one dotted line 114. The upper side of the mesa, i.e. the surface 4 of the semiconductor body 1, is accordingly present between the dotted lines 114. The traces 16 which may remain behind on a wall 6, 56 after etching have been left out for clarity in FIG. 5.

This embodiment is favourable especially when comparatively small semiconductor elements 100 are required, for example, on account of design requirements such as frequency range and desired power. The dimensions of the connection surfaces 12, 13 are comparatively great compared with the semiconductor sub-elements 100. The semiconductor sub-elements 100 can have comparatively small dimensions in that the semiconductor element is split up into a number of sub-elements, whereby the design requirements can be complied with, while nevertheless there are no problems involving short-circuits of connection surfaces 12, 13.

FIGS. 3 to 7 show how the semiconductor element comprises a transistor with base and emitter contacts as the connection points 2, 3 of the semiconductor element. The connection surface 13 for the emitter lies in the first depression 5 and the connection surface 12 for the base in the further depression 50. This embodiment has the advantage that the positioning possibility for the connection surface 13 of the emitter zone 24 is wide. Thus the connection surface 13 for the emitter may be placed in such a position around the semiconductor element that the length of a connection between the connection surface 13 and a connection leg of the lead frame is small, while it is also possible in a simple manner to provide more than one connection surface 13, as shown in the embodiment of FIGS. 5, 6 and 7. This is especially important for comparatively high-frequency transistors because the length of a connection between the connection surface 13 and a connection leg of the lead frame forms an impedance which adversely affects the high-frequency properties of the transistor; in fact, an increase in the emitter impedance increases the feedback and reduces the transistor gain. When several connection surfaces 13 are connected in parallel and connected to a connection leg of the lead frame, the impedance is reduced accordingly. No short-circuit takes place between emitter and base of the transistor through the use of the invention.

FIGS. 5 and 6 show that in a further embodiment of the invention a further connection point 20 of the semiconductor element provided with a connection surface 80 is present on the bottom 7 of a depression 5. The further connection point 20 on the bottom 7 of the depression 5 in this example connects a collector zone of the semiconductor element which is connected to the connection surfaces 80 on the bottom 7. The connection surfaces 80 serve to make connection with a connection leg of the lead frame. There are two connection surfaces 13 and 80 for different connection points 3 and 20 then on the bottom 7 of this depression 5, one each for the emitter region 24 and for the collector region 21. Each semiconductor sub-element in this example is provided with its own connection surface 80. Since the connection points 20 of the collector region 21 are not connected to the connection surfaces 80 by means of a conductor track on a wall 6 of the depression 5, there will be no short-circuits between any further connection point 20 and the connection point 3 adjoining the surface 4; i.e. in spite of the fact that there are two connection surfaces 13 and 80 in the depression 5, there is only one conductor track 11 on the wall 6 of this depression 5, which is that track 11 which interconnects the connection point 3 adjoining the surface 4 with its connection surfaces 13 on the bottom 7 of the depression 5.

The semiconductor devices of FIGS. 3 to 6 may be manufactured by a standard method, for example, as follows. A 1.5 μm thick $n^-$-type epitaxial layer 22, which forms a space charge region for the transistor collector, is grown on a highly doped $n^+$-type silicon substrate 21 in a reactor. Then a 50 nm thick p-type layer 23 is grown epitaxially in a reactor. Subsequently, approximately 300 nm plasma oxide is deposited on the surface 4 at a deposition temperature of approximately 400° C. The plasma oxide is patterned into an etching mask by means of photolithographical techniques, after which mesa structures are realised through etching of depressions 5, 50. Etching starts with anisotropic plasma etching through the p-type region 23, after which the $n^-$-type region 22 is etched away with a KOH etching treatment. Etching is stopped in the highly doped $n^+$region 21. The etching mask is then removed. Subsequently, a plasma oxide 8 of 300 nm thickness is deposited by standard techniques over the entire surface 4 of the semiconductor body 1, over the walls 6, 56 and the bottoms 7, 57 of the depressions 5, 50. This oxide 8 passivates the walls 6, 56 of the depressions 5, 50 where pn junctions between the regions 22, 23 come to the surface. A connection point 2 for the transistor base connection is provided in this oxide 8 in the form of contact holes 2. The p+-type base contact region 25 is then provided in known manner through the base contact holes 2. Then the connection point 3 for the transistor emitter connection is provided in the form of contact holes 3, and n+-type emitter regions 24 are provided through these emitter contact holes 3. For the semiconductor device according to FIGS. 5, 6 and 7, the connection point 20 for the transistor collector connection is also made in the form of contact holes 20. Then conductor tracks 10, 11 of gold are provided in the contact holes 2 and 3 in known manner by the application of a conducting layer and sputter etching, connecting the connection points 2, 3 to the connection surfaces 12, 13. For the semiconductor device according to FIGS. 5, 6 and 7, connection surfaces 80 for the transistor collector connection are simultaneously manufactured as well. A connection surface 90 for the collector is provided on a lower side of the semiconductor substrate 21 in the case of the semiconductor device according to FIGS. 3 and 4.

The semiconductor bodies, of which a large number are manufactured next to one another on a semiconductor wafer, are finally detached from one another by scoring and breaking. The semiconductor body is given a final mounting on a lead frame and enclosed in a housing.

The invention is not limited to the embodiments described above. Thus a number of depressions 50 may be present. The semiconductor device may then, for example, have a mesa structure in the shape of a honeycomb. Walls of the honeycomb then form the separations (dams) of the depressions, while a semiconductor (sub-) element is present at each intersection of the separations. The semiconductor material of the semiconductor body may be germanium, silicon-germanium, GaAs, or some other semiconductor instead of silicon. Techniques other than those described, for example, diffusion instead of implantation or epitaxy, or wet chemical etching instead of plasma etching may alternatively be used. The oxide layer 8 may be TEOS instead of plasma oxide. The doping types may also be the opposites of those in the embodiments, i.e. the first conductivity type is the p-type then. The doping levels may also vary without detracting from the invention. Transistors were described in the embodiments, but the invention may also be applied to other semiconductor elements such as, for example, diodes or thyristors. It is also possible for the mesa structure to comprise several semiconductor elements which are provided with connection points at the upper side of the mesa structure. These connection points are then connected to connection surfaces in different depressions. The semiconductor elements may also be interconnected in the mesa structure so as to form further semiconductor elements in the form of, for example, cascode circuits, or may may be combined with, for example, resistor regions and/or capacitors, i.e. the mesa structure then comprises a circuit provided with a semiconductor element, which circuit has connection points which are connected by conductor tracks to connection surfaces in various further depressions.

We claim:

1. A semiconductor device with a semiconductor body comprising a semiconductor element with connection points, which semiconductor element adjoins a surface of the semiconductor body and is laterally insulated and surrounded by a first depression in the surface, which depression is provided with a first wall and a first bottom, the surface of the semiconductor body and the first wall and the first bottom of the depression being covered with an insulating layer, and the connection points being provided in the insulating layer on the surface of the semiconductor body and being connected to conductor tracks which connect the connection points across one of said first and a second wall to connection surfaces belonging to the connection points and situated on one of said first and a second bottom, wherein a further depression having said second wall and said second bottom is present in the surface of the semiconductor body and surrounded by the first depression, a connection surface being present on each of said first and said second bottom, each connection surface being connected to one of said connection points on the surface of the semiconductor body through one of said conductor tracks.

2. A semiconductor device as claimed in claim 1, characterized in that the conductor tracks comprise gold.

3. A semiconductor device as claimed in claims 1, characterized in that the walls of the depressions enclose an angle of more than 50° with the bottoms of the depressions.

4. A semiconductor device as claimed in claim 1, characterized in that the conductor tracks are patterned only on the surface of the semiconductor body and on the bottom of the depressions and comprise an unpatterned conductive layer on the walls.

5. A semiconductor device as claimed in claim 1, characterized in that a further connection point of the semiconductor element provided with a connection surface is present on the bottom of a selected depression.

6. A semiconductor device as claimed in claims 1, characterized in that the semiconductor element comprises a plurality of semiconductor sub-elements which are interconnected by dams, the semiconductor sub-elements and the dams enclosing the further depression.

7. A semiconductor device as claimed in claim 1, characterized in that the semiconductor element comprises a transistor with base and emitter contacts as the connection points, the connection surface for the emitter contact lying in the first depression and the connection surface for the base contact in the further depression.

* * * * *